United States Patent [19]

Asahi et al.

[11] Patent Number: 4,855,894
[45] Date of Patent: Aug. 8, 1989

[54] FREQUENCY CONVERTING APPARATUS

[75] Inventors: Nobumitsu Asahi, Sagamihara; Tetsuo Ikeda, Hiroshima; Seiji Kawase, Yokohama, all of Japan

[73] Assignee: Kabushiki Kaisha Kenwood, Tokyo, Japan

[21] Appl. No.: 198,576

[22] Filed: May 25, 1988

[30] Foreign Application Priority Data

May 25, 1987 [JP] Japan ................................ 62-77372
Jul. 30, 1987 [JP] Japan ................................ 62-115868

[51] Int. Cl.$^4$ ............................................. H02M 5/00
[52] U.S. Cl. ...................................... 363/157; 370/70; 455/190; 455/208
[58] Field of Search ................. 363/8, 157; 370/70, 370/123; 455/205, 207, 208, 323, 188, 189, 190

[56] References Cited

U.S. PATENT DOCUMENTS

| | | | |
|---|---|---|---|
| 3,676,598 | 7/1972 | Kurth | 370/70 |
| 3,808,412 | 4/1974 | Smith | 370/70 |
| 4,103,110 | 7/1978 | Picquendar et al. | 370/70 |
| 4,214,212 | 7/1980 | Dipietromaria | 455/190 |
| 4,373,209 | 2/1983 | Kaneda | 455/208 |
| 4,435,841 | 3/1984 | Dobrovolny | 455/190 |
| 4,442,540 | 4/1984 | Allen | 370/70 |

Primary Examiner—Peter S. Wong
Attorney, Agent, or Firm—Gerald J. Ferguson, Jr.

[57] ABSTRACT

A frequency converting apparatus including a sample circuit and a bandpass filter wherein an input analog signal is sampled at predetermined periods only for predetermined time intervals to produce or increase the harmonic components of the original analog signal, a desired frequency component is extracted through the bandpass filter from the harmonic components to thereby convert the original signal having a particular frequency band to a signal having a higher-frequency band.

4 Claims, 3 Drawing Sheets

FREQUENCY CONVERTING APPARATUS

BACKGROUND OF THE INVENTION

1. Field of the invention and Related Art

The present invention relates to a frequency converting apparatus applicable to a transmitter circuit of a digital signal processing system which performs various modulating and filtering operations using digital signal processing techniques in radio communication devices.

Conventionally, a frequency conversion system of this type is constructed, for example, as shown in FIG. 1. The system includes a D/A converters, and a low pass filter 5 which extracts the basic frequency band of the sampled signal, the center frequency which is indicated by fc. The frequency characteristic of the low pass filter 5 is shown in FIG. 3 where fs is the sample frequency.

It is assumed that, for example, when an AM-modulated signal having a carrier frequency of fc and an occupied bandwidth of $\Delta f$ is to be extracted, the signal is sampled at the A/D converter 2 using a frequency fs higher than twice (fc+$\Delta f$/2). The digital signal output from the A/D converter 2 is delivered to a digital signal processor 3 to be subjected to predetermined digital AM modulation processing. The digital signal output from the processor 3 is converted back to an analog signal by the D/A converter 4 and then supplied to a low pass filter 5 which has a cut-off frequency of fs/2 to thereby extract the analog AM-modulated signal.

Another method is shown in FIG. 2 in which a signal having a frequency band, for example, a carrier frequency fc, lower than the frequency band of a signal to be extracted is obtained from a low pass filter 7. The output signal from the low pass filter 7 and a sinusoidal signal having a frequency fo from a local oscillator 9 is mixed at a mixer 8 to provide a mixed output via a bandpass filter 10 as a signal having a desired high-frequency band.

According to the former prior art, as the carrier frequency fc increases, the sample frequency fs must be increased accordingly. Therefore, the prior art has the problem that it must use a high speed A/D converter.

According to the latter prior art, the bandpass filter and mixer must additionally be provided, so that the whole scale of the system increases undesirably. Furthermore, the frequencies fs, fc and fo must be appropriately selected such that a spurious radiation produced by the mixing processing does not interfere with the band. Thus there is the problem that the freedom of frequency selection and thus a range of applications are limited.

In addition, if desired frequencies have a band width BW and a central frequency (fc +fo), the frequency characteristic of the bandpass filter 10 is shown in FIG. 4.

As the band width BW to be extacted from the bandpass filter 10 is wide, the lower limit frequency of the pass band comes close to the frequency fo as shown in FIG. 4 and the bandpass filter is required to have a sharp cut-off slope characteristic. Thus the first bandpass filter has the problem that it must be composed of elements of a high quality factor or of a high order.

SUMMARY OF THE INVENTION

The object of this invention is to provide a frequency converting apparatus which eliminates the above problems, namely, which is capable of extracting a signal having a desired frequency band, using only low-speed A/D and D/A converters and a few of circuits.

In one aspect to solve the above problems, frequency converting apparatus according to the present invention for converting a particular frequency band signal to a higher frequency band signal, comprises input means for providing a signal to be subjected to frequency conversion; sample means for sampling the provided signal at prodetermined periods for predetermined time widths for generating or increasing harmonic components of the signal provided by input means; and a bandpass filter for extracting desired frequency band components of the signal containing harmonic components provided by the sample means.

In another aspect to solve the above problems, frequency converting apparatus according to the present invention for converting a particular frequency band signal to a higher frequency band signal, comprises input means for providing a signal to be subjected to frequency conversion; sample means for sampling the provided signal at predetermined periods for predetermined time widths for generating or increasing harmonic components of the signal provided by input means; a first bandpass filter for extracting predetermined frequency band components of the signal containing harmonic components provided by the sample means; a local oscillator for generating a continuous signal having a predetermined frequency; a mixer for mixing the output signal from the first bandpass filter and the output signal from the local oscillator to generate the sum and difference of those output signals; and a second bandpass filter for extracting desired frequency band components from the output of the mixer.

An input analog signal is converted to a digital signal, which is then subjected to predetermined digital operations including modulation and filtering. The resulting digital signal is converted to an analog signal using a D/A converter to thereby provide a signal having a desired frequency band. In that case, the output from the D/A converter is input to extracted by an analog switch or the like for predetermined time intervals at the same sample period as the input analog signal is converted to the digital signal. The extracted output is provided via a bandpass filter as an analog signal having a desired frequency band.

A signal obtained by sampling an analog signal naturally includes the frequency components F(f) of the analog signal and harmonic components F(f±nfs) each being an integer multiple of the sample frequency fs. The spectrum of these harmonic components includes a frequency shift in the original spectrum. This relationship is still kept even if the sampled signal is quantized and then subjected to any digital signal processing. The present invention utilizes this property to sample an analog signal with a relatively low frequency, and performs modulation and other digital signal processing operations on the resulting signal to extract harmonic components belonging to a predetermined band. The power level of the harmonic components is closely related with the pulse width of the signal obtained by the sampling. Therefore, in order to extract the desired harmonic components effeciently by power levels, the D/A output must be sampled at the sample periods for predetermined appropriate time intervals. Usually, the time interval is selected such that the power level of the carrier frequency vicinity to be extracted is maximized.

Lastly, the output from the analog switch is extracted via a bandpass filter having a central frequency equal to the desired carrier frequency as an analog signal having a desired band, the central frequency of which is fc.

With the above mentioned structure, the function of the frequency converting apparatus is realized by using a sample frequency having twice or more the bandwidth of the output signal. Therefore, advantageously, the A/D and D/A converters used in the inventive apparatus may be of a relatively low speed. In order to efficiently extract a signal having a frequency band higher than the signal frequency fc, a mixer is provide at the output of the bandpass filter (hereinafter referred to as a first bandpass filter) and a second bandpass filter to which the output of the mixer is input is provided.

With the above mentioned structure, the use of the first bandpass filter allows the selection of a signal having a frequency band higher than that of a signal extracted using the low pass filter in the conventional method. Therefore, when the frequency mixing is than performed by the mixer to provide a higher frequency and this frequency is, in turn, extracted by the second bandpass filter, the cut-off characteristic required of the second bandpass filter may be gentle compared to the prior art.

DESCRIPTION OF THE PREFERRED EMBODIMENT

Embodiments of the present invention will now be described in detail with reference to the drawings.

Figure 5:
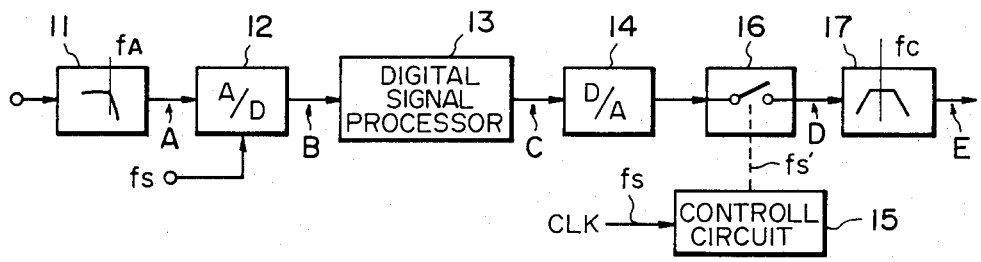
FIG. 5 is a block diagram showing a first embodiment of the present invention.

FIG. 5 is a block diagram showing the structure of a first embodiment of the present invention.

A signal such as a voice signal is provided to a low pass filter 11 to limit the signal within a predetermined band. The output of the low pass filter 11 is supplied to an A/D converter 12 to be converted to a digital signal, using a sample frequency fs. The resulting signal is then subjected to a predetermined algorism operation by a digital signal precessor 13. The output from the processor 13 is supplied to a D/A converter 14 where the signal is converted to an analog signal which is then supplied to an analog switch 16. The analog switch 16 extracts portions of the analog signal for predetermined time intervals at the same sample period as that of the A/D converter 12. The extracted signal is then supplied to a bandpass filter 17 which has a central frequency fc and a bandwidth corresponding to a frequency band to be extracted.

The operation of the present embodiment having the above structure will now be described by taking a DSP modulation, as an example, in which the digital signal processing algorithm is simplest.

The input analog signal is limited by the low pass filter 11 within a predetermined bandwidth, for example, of 3 KHz and the resulting signal A is input to the A/D converter 12. The frequency spectrum and time waveform of the signal A are as shown in Figs. 6 (a1) and (a2), respectively.

Figure 6:
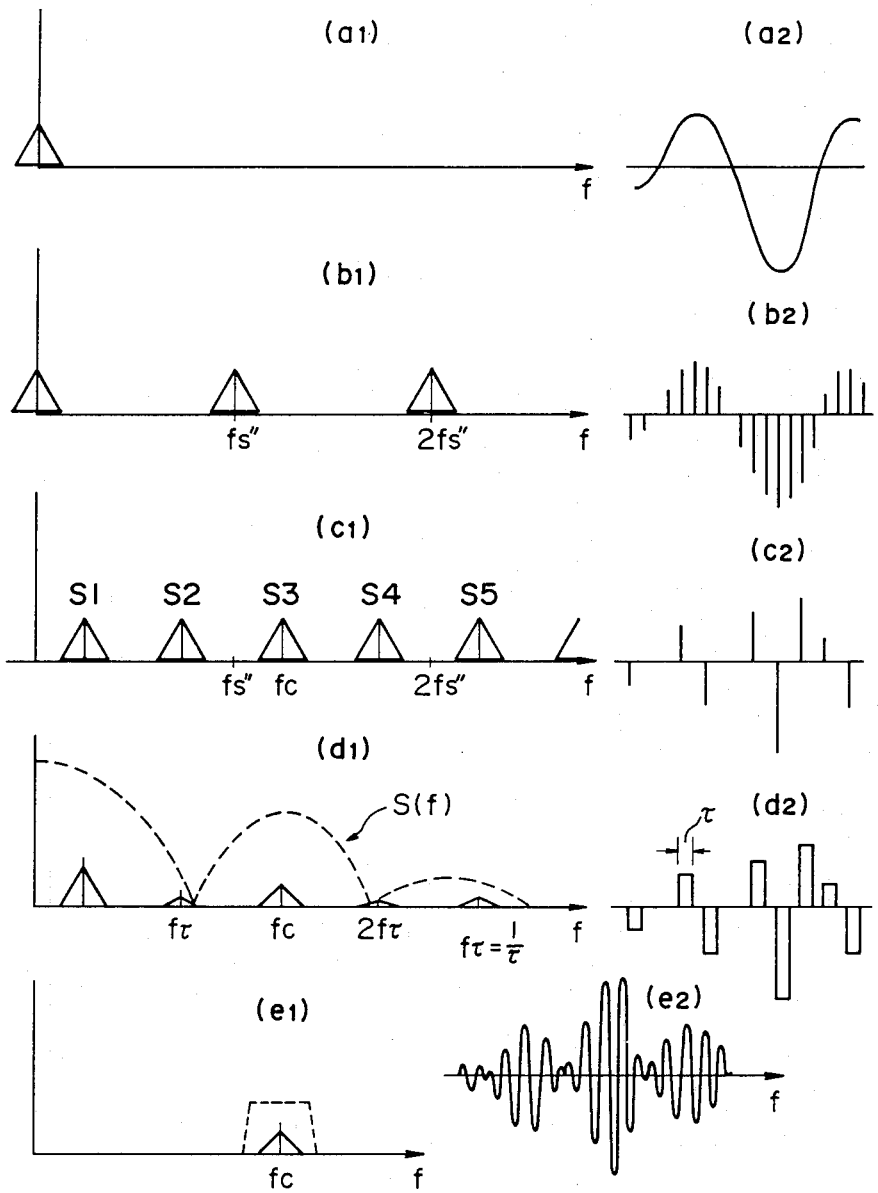
FIG. 6 illustrates the signal spectrum used in the operation of the embodiment.

The signal A is sampled by the A/D converter 12 using a sample frequency fs and converted to a digital data signal B, the frequency spectrum and waveform of which are shown as shown in FIGS. 6 (b1) and (b2), respectively. FIG. 6 (b1) schematically shows the subspectrums disposed at intervals of frequency fs.

The digital data signal B is subjected to DSP modulation processing in a digital form at the digital signal processor 13. If the carrier frequency $f_{DC}=fs/4$ for DSB modulation, the DSP modulated signal becomes $+1, 0, -1, 0, +1, 0, \ldots$, and this series of data is multiplied by the sampled digital signals B to provide a digital DSB modulation. The spectrum of the modulated output from the processor 3 appears at positions of $(n\pm\frac{1}{4})fs$ where n is an integer, as shown in FIG. 6 (c1) and the time waveform of the modulated output is shown in FIG. 6 (c2).

The output from the processor 13 is supplied to the D/A converter 4 where the output is converted to an analog signal which is then extracted by the analog switch 16 for predetermined time intervals $\tau$ at sample periods of 1/fs as an analog signal from the D/A converter 14. As a result, the spectrum of the output D from the analog switch 16 is as shown in FIG. 6 (d2). The spectrum is the product of the spectrum of the output from the signal processor 3 and the junction $S(f)=\pi|\sin(\pi f\tau)/\pi f\tau|$. The time width $\tau$ is properly selected on the basis of the formula S(f) depending on applications such that the power level of the carrier frequency fc vicinity (fc = 5/4 fs in the embodiment of FIG. 6) is maximum or that the frequency characteristic of the frequency band to be extracted is sufficiently flat. For example, as shown in FIG. 6 (d1), $\tau$ can be determined such that the frequency band around the first maximum of the function S(f) is extracted. In that case, the relationship $fc=3/2\tau$ is held.

The signal extracted from the analog switch 16 is provided via the bandpass filter 17 having a central frequency fc and a bandwidth which slightly exceeds 6 KHz in the present embodiment. The DSB modulated signal provided via the filter 17 has a spectrum as shown in FIG. 6 (e1) and a time waveform as shown in FIG. 6 (e2).

As described above, the output data from the A/D converter 12 contains not only the frequency components f of the orginal signal but also harmonic components related by $nfs\pm f$. After the digital signal processing and analog conversion, the interval $\tau$ is selected at the analog switch 16 such that the power level of the carrier frequency fc vicinity is maximum and the analog signal is extracted at the sample periods.

As just described above, the present invention extracts the harmonic outputs contained in the sampled signal and uses them, so that the sample frequency fs at the A/D converter 12 must be selected within a range satisfying the relationship $nfs\pm f_{DC}=fc$.

Figure 7:
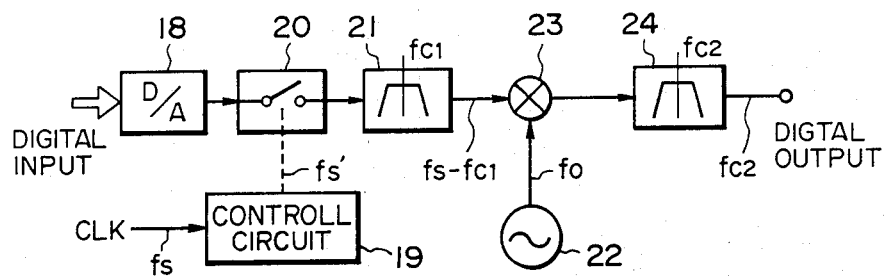
FIG. 7 is a block diagram showing a second embodiment of the present invention.

FIG. 7 is a block diagram of a second embodiment of the present invention. This embodiment is intended to extract a frequency band high compared to the first embodiment while keeping the power level high. The digital signal resulting from the predetermined digital processing including modulation, etc., is converted by the D/A converter 18 to an analog signal which is then supplied to analog switch 20, the output of which is in turn supplied to first bandpass filter 21, as in the first embodiment.

The output from the first bandpass filter 21 and the output from an local oscillator 22 having a oscillating frequency fo are mixed by a mixer 23 to be converted to a higher frequency signal. This signal is then provided to a second bandpass filter 24 which provides a signal free of the oscillating frequency fo from the local oscillator 22 and other unwanted signals.

Figure 8:
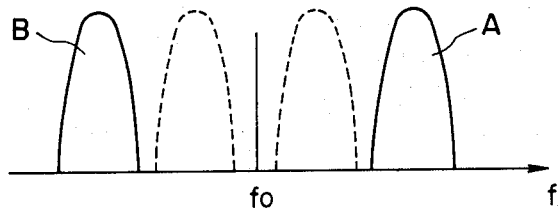
FIG. 8 illustrates the spectrum of the output signal from a mixer in the second embodiment of the present invention.

The output from the mixer 23 is as shown in FIG. 8. Here, the upper and lower side signals with reference to the oscillating frequency fo are designated as A and B, respectively. The signal shown by the broken lines, namely, the signals closer to the oscillating frequency from the local oscillator 22 are already eliminated by the first bandpass filter 21. In the present embodiment, the first bandpass filter 21 is assumed to extract the upper side signal A.

Figure 9:
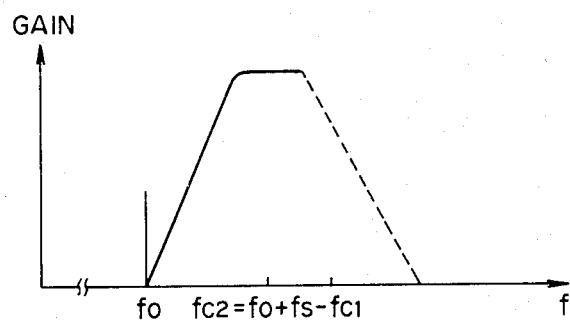
FIG. 9 illustrates the frequency characteristic of a second bandpass filter in the second embodiment.

FIG. 9 shows the frequency characteristic of the second bandpass filter 24 in which the passband deviates from the local oscillator frequency fo by one upper side portion as shown by the broken lines in FIG. 8 and the characteristic required of the second bandpass filter 24 is alleviated. The reason for this is that the conventional apparatus uses the low pass filter 7, so that it can extract only the components of the frequency band S1 shown in FIG. 6 (c1) while the present embodiment uses the first bandpass filter 21 and analog switch 20 to thereby allow the components, for example, of the frequency band S2 having a central frequency $(fs-f_{CD})$ The central frequency of the frequency band S2 is $fs-f_{CD}$ which is higher than the central frequency of the frequency band S1; in the present embodiment, the central frequency $fs-f_{CD}$ of the frequency band S2 is three times as high as that of the frequency band S1, so that if frequency conversion is performed by the mixer 23, the converted frequency deviates sufficiently from the oscillating frequency fo of the local oscillator 22.

While in the embodiment the component of the frequency band S2 shown in FIG. 6 (c1) is extracted by the first bandpass filter 21, any one component higher than the frequency band S3 may be extracted. Such operation is not performed by the prior art.

As described above, according to the present invention, high-speed A/D and D/A converters are not required and, instead, for example, relatively low speed A/D and D/A converters for audioband applications may be used.

Figure 1:
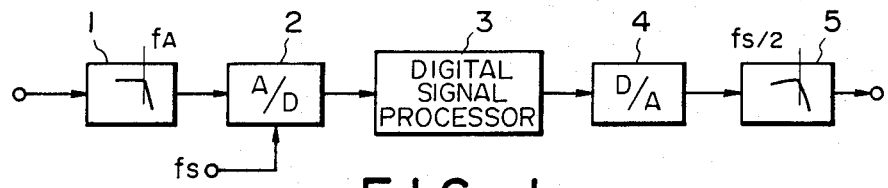
FIGS 1 and 2 are block diagrams showing the prior art structures.
Figure 2:
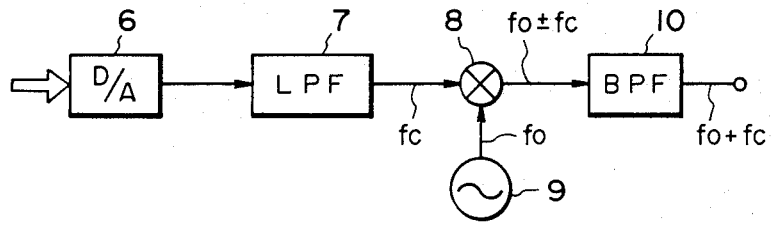
Figure 3:
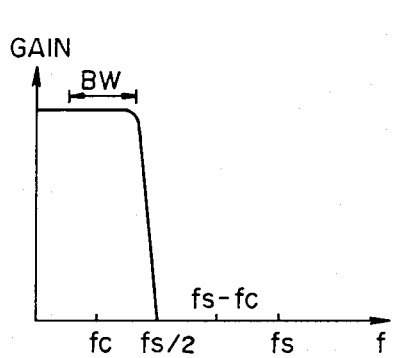
FIG. 3 illustrates the frequency characteristic of a low pass filter 7 used in the prior art structure.
Figure 4:
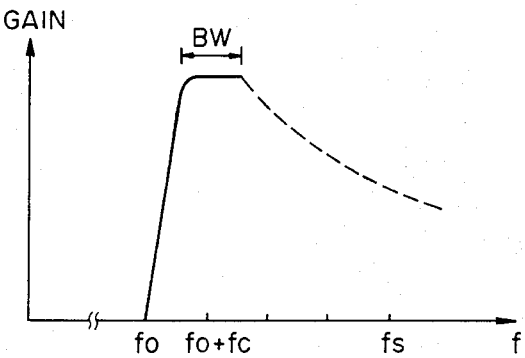
FIG. 4 illustrates the frequency characteristic of a bandpass filter 10 used in the prior art structure.

For example, in the present invention, the usual sample frequency fs may slightly exceed 12 KHz (twice the occupied bandwidth of the DSB signal) in principle. If a modulated intermediate-frequency signal having a central frequency fc=455 KHz is desired, it is necessary to select the sample frequency fs so as to be substantially 1 MHz in the former prior art shown in FIG. 1. It will be understood from comparison between this prior art and the particular embodiment that a very low sample frequency fs can be used in the present embodiment.

The first embodiment is obtained by replacing the low pass filter 5 in the former prior art with a bandpass filter 17 and adding the new analog switch, so that the circuit scale is not so large.

If any intermediate frequency modulation signal is to be extracted, a sample frequency may be selected appropriately to thereby increase the freedom of selection.

In the second embodiment of the present invention, the characteristic required of the bandpass filter at the output side of the mixer is gentle, the structural order of the bandpass filter is reduced, and not required to be of high quality factor Q.

If an amplifier is provided between the first bandpass filter 21 and the subsequent mixer 23, harmonic distortions caused by the amplifier and mutual modulation distortion caused by the mixer are eliminated advantageously by the bandpass filter 24 after the mixer.

What is claimed is:

1. Apparatus for frequency-converting a signal from a lower frequency band into a higher frequency band, comprising:
    means for receiving the signal to be subjected to frequency conversion;
    means for sample-holding the received signal by using a sample-hold signal, a sample period and hold interval of the sample-hold signal being determined so that the top of a selected lobe in the spectrum of the sample-hold signal corresponds to the higher frequency band; and
    a bandpass filter for extracting frequency components at the higher frequency band from the sample-held received signal to produce the signal at the higher frequency band.

2. Apparatus according to claim 1, wherein said selected lobe is the first occurrence full lobe in the spectrum of the sample-hold signal.

3. Apparatus according to claim 1 further comprising a digital modulator which includes an A/D converter for converting an analog signal into a digital signal, a processor responsive to the converted digital signal for digitally producing a modulated digital signal and D/A converter for converting the modulated digital signal into a modulated analog signal,
    wherein said receiving means receives the modulated analog signal.

4. A digital modulated comprising:
    an A/D converter for converting an analog baseband signal into a digital baseband signal;
    a processor responsive to the digital baseband signal for producing a modulated digital signal;
    a D/A converter for converting the modulated digital signal into a modulated analog signal;
    means for sample-holding the modulated analog signal by using a sample-hold signal, a sample period and hold interval of the sample-hold signal being determined so that the top of a selected lobe in the spectrum of the sample-hold signal corresponds to a modulation carrier frequency; and
    a bandpass filter for extracting frequency components from the sample-held modulated analog signal, the center frequency of the bandpass filter corresponding to the modulation carrier frequency.

* * * * *